United States Patent
Choi et al.

(10) Patent No.: US 8,710,640 B2
(45) Date of Patent: Apr. 29, 2014

(54) INTEGRATED CIRCUIT PACKAGING SYSTEM WITH HEAT SLUG AND METHOD OF MANUFACTURE THEREOF

(75) Inventors: DaeSik Choi, Seoul (KR); JoungIn Yang, Seoul (KR); MinJung Kim, Kwang-ju (KR); KyungEun Kim, Ichon-si (KR)

(73) Assignee: Stats ChipPac Ltd., Singapore (SG)

( * ) Notice: Subject to any disclaimer, the term of this patent is extended or adjusted under 35 U.S.C. 154(b) by 38 days.

(21) Appl. No.: 13/325,359

(22) Filed: Dec. 14, 2011

(65) Prior Publication Data

US 2013/0154078 A1 Jun. 20, 2013

(51) Int. Cl.
*H01L 23/02* (2006.01)
(52) U.S. Cl.
USPC ........... 257/686; 257/706; 257/707; 257/713; 257/719; 257/730; 438/106; 438/112; 438/124; 438/127
(58) Field of Classification Search
USPC .................. 257/706, 686, 707, 730, 719, 713
See application file for complete search history.

(56) References Cited

U.S. PATENT DOCUMENTS

| | | | |
|---|---|---|---|
| 6,700,783 B1 * | 3/2004 | Liu et al. | 361/704 |
| 7,863,732 B2 | 1/2011 | Chow et al. | |
| 7,928,552 B1 | 4/2011 | Cho et al. | |
| 2007/0200225 A1 | 8/2007 | Ibrahim et al. | |
| 2009/0294947 A1 * | 12/2009 | Tain et al. | 257/686 |
| 2009/0309204 A1 * | 12/2009 | Ha | 257/686 |
| 2011/0227209 A1 | 9/2011 | Yoon et al. | |
| 2011/0233736 A1 | 9/2011 | Park et al. | |
| 2012/0241940 A1 * | 9/2012 | Pagaila et al. | 257/706 |

* cited by examiner

*Primary Examiner* — Alexander Sofocleous
*Assistant Examiner* — Joannie A Garcia
(74) *Attorney, Agent, or Firm* — Ishimaru & Associates LLP

(57) ABSTRACT

A method of manufacture of an integrated circuit packaging system includes: mounting an integrated circuit over a package carrier; mounting a conductive connector over the package carrier; forming an encapsulation over the integrated circuit, the encapsulation having a recess exposing the conductive connector; and mounting a heat slug over the encapsulation, the heat slug having an opening with an opening width greater than a recess width of the recess, the opening exposing a portion of a top surface of the encapsulation.

18 Claims, 12 Drawing Sheets

INTEGRATED CIRCUIT PACKAGING SYSTEM WITH HEAT SLUG AND METHOD OF MANUFACTURE THEREOF

TECHNICAL FIELD

The present invention relates generally to an integrated circuit packaging system, and more particularly to an integrated circuit packaging system with a heat slug.

BACKGROUND ART

Increased miniaturization of components, greater packaging density of integrated circuits ("ICs"), higher performance, and lower cost are ongoing goals of the computer industry. Semiconductor package structures continue to advance toward miniaturization, to increase the density of the components that are packaged therein while decreasing the sizes of the products that are made therefrom. This is in response to continually increasing demands on information and communication products for ever-reduced sizes, thicknesses, and costs, along with ever-increasing performance.

These increasing requirements for miniaturization are particularly noteworthy, for example, in portable information and communication devices such as cellular phones, hands-free cellular phone headsets, personal data assistants ("PDA's"), camcorders, notebook computers, and so forth. All of these devices continue to be made smaller and thinner to improve their portability. Accordingly, large-scale IC ("LSI") packages that are incorporated into these devices are required to be made smaller and thinner. The package configurations that house and protect LSI require them to be made smaller and thinner as well.

As the integrated circuit technology advances, more circuit cells can be fabricated in a similar die area so that substantially increased functionality can be accomplished on a given integrated circuit die. The added functionality and increase in the number of circuits generally involves a larger amount of power dissipation. The heat is transmitted from one integrated circuit to the other and there is no significant dissipation path other than through the solder ball to the motherboard. The increased heat in the package can significantly reduce the life of the integrated circuits in the package.

Thus, a need still remains for an integrated circuit packaging system providing low cost manufacturing and improved reliability. In view of the ever-increasing need to save costs and improve efficiencies, it is increasingly critical that answers be found to these problems. In view of the ever-increasing commercial competitive pressures, along with growing consumer expectations and the diminishing opportunities for meaningful product differentiation in the marketplace, it is critical that answers be found for these problems. Additionally, the need to reduce costs, improve efficiencies and performance, and meet competitive pressures adds an even greater urgency to the critical necessity for finding answers to these problems.

Solutions to these problems have been long sought but prior developments have not taught or suggested any solutions and, thus, solutions to these problems have long eluded those skilled in the art.

DISCLOSURE OF THE INVENTION

The present invention provides a method of manufacture of an integrated circuit packaging system including: mounting an integrated circuit over a package carrier; mounting a conductive connector over the package carrier; forming an encapsulation over the integrated circuit, the encapsulation having a recess exposing the conductive connector; and mounting a heat slug over the encapsulation, the heat slug having an opening with an opening width greater than a recess width of the recess, the opening exposing a portion of a top surface of the encapsulation.

The present invention provides an integrated circuit system including: a package carrier; an integrated circuit over the package carrier; a conductive connector over the package carrier; an encapsulation over the integrated circuit, the encapsulation having a recess exposing the conductive connector; and a heat slug over the encapsulation, the heat slug having an opening with an opening width greater than a recess width of the recess, the opening exposing a portion of a top surface of the encapsulation.

Certain embodiments of the invention have other steps or elements in addition to or in place of those mentioned above. The steps or element will become apparent to those skilled in the art from a reading of the following detailed description when taken with reference to the accompanying drawings.

BEST MODE FOR CARRYING OUT THE INVENTION

Figure 1:
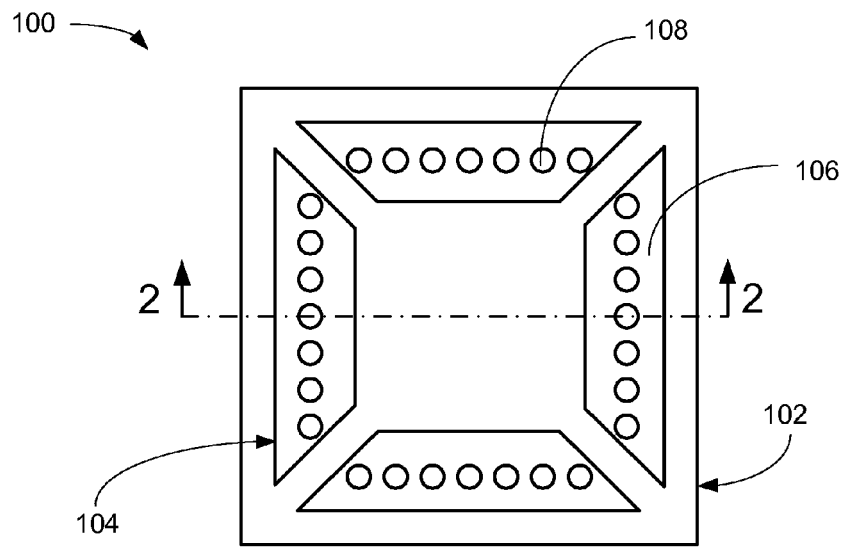
FIG. 1 is a top view of an integrated circuit packaging system in a first embodiment of the present invention.

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail.

The drawings showing embodiments of the system are semi-diagrammatic and not to scale and, particularly, some of the dimensions are for the clarity of presentation and are shown exaggerated in the drawing FIGs. Similarly, although the views in the drawings for ease of description generally show similar orientations, this depiction in the FIGs. is arbitrary for the most part. Generally, the invention can be operated in any orientation.

In addition, where multiple embodiments are disclosed and described having some features in common, for clarity and ease of illustration, description, and comprehension thereof, similar and like features one to another will ordinarily be described with similar reference numerals. The embodiments have been numbered first embodiment, second embodiment, etc. as a matter of descriptive convenience and are not intended to have any other significance or provide limitations for the present invention.

For expository purposes, the term "horizontal" as used herein is defined as a plane parallel to the active side of the integrated circuit, regardless of its orientation. The term "vertical" refers to a direction perpendicular to the horizontal as just defined. Terms, such as "above", "below", "bottom", "top", "side", "higher", "lower", "upper", "over", and "under", are defined with respect to the horizontal plane, as shown in the figures.

The term "on" means that there is contact between elements. The term "directly on" means that there is direct contact between one element and another element without an intervening element.

The term "active side" refers to a side of a die, a module, a package, or an electronic structure having active circuitry fabricated thereon or having elements for connection to the active circuitry within the die, the module, the package, or the electronic structure. The term "processing" as used herein includes deposition of material or photoresist, patterning, exposure, development, etching, cleaning, and/or removal of the material or photoresist as required in forming a described structure.

Referring now to FIG. 1, therein is shown a top view of an integrated circuit packaging system 100 in a first embodiment of the present invention. The integrated circuit packaging system 100 can include a heat slug 102, which is defined as a conductive structure that can transfer heat generated within the integrated circuit packaging system 100 to the external environment. The term "external" refers to outside the integrated circuit packaging system 100. The heat slug 102 can be a single integral structure having an opening 104.

An encapsulation 106 can be exposed within the opening 104. The encapsulation 106 is defined as a cover surrounding and protecting the contents in the integrated circuit packaging system 100 from the environment and hermetically seals the contents internal to the integrated circuit packaging system 100. The encapsulation 106 can include an epoxy molding or resin.

A conductive connector 108 can be exposed within the opening 104. The conductive connector 108 is defined as a connection interface for electrical connection to other components. For example, the conductive connector 108 can include a solder bump or a conductive bump.

For illustrative purposes, the integrated circuit packaging system 100 is shown having one row of the conductive connector 108 shown through the opening 104, although it is understood that the configuration for the conductive connector 108 can be different. For example, there can be multiple rows of the conductive connector 108 for shown in the opening 104 or different number of rows of the conductive connector 108 for the opening 104 along different sides of the integrated circuit packaging system 100.

Figure 2:
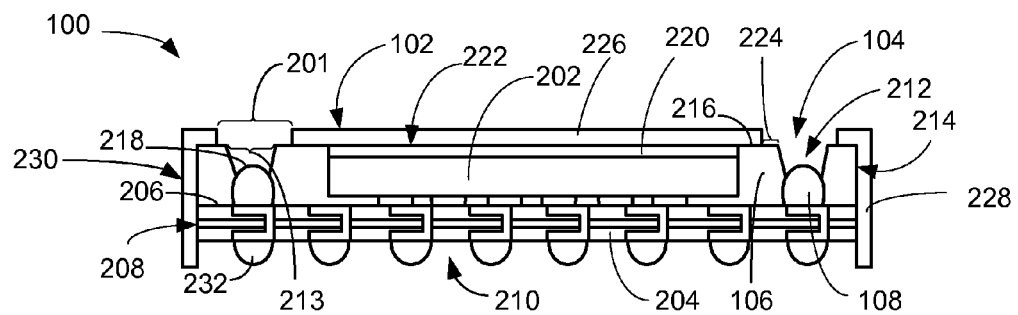
FIG. 2 is a cross-sectional view of the integrated circuit packaging system along the line 2-2 of FIG. 1.

Referring now to FIG. 2, therein is shown a cross-sectional view of the integrated circuit packaging system 100 along the line 2-2 of FIG. 1. The integrated circuit packaging system 100 can include an integrated circuit 202 mounted over a package carrier 204. The integrated circuit 202 is defined as chip with active circuitry fabricated thereon. For example, the integrated circuit 202 can include a flip chip, a wire bonded chip, or a packaged integrated circuit. The package carrier 204 is defined as a mounting structure for the integrated circuit 202 or other electrical components as well as providing electrical connections between, to, and from the devices mounted thereto.

The package carrier 204 can include a component side 206 and a carrier side 208. The component side 206 can represent a non-vertical side of the package carrier 204 facing the integrated circuit 202. The carrier side 208 can represent a non-horizontal side of the package carrier 204 facing away from the integrated circuit 202. For example, the conductive connector 108 can be mounted over the component side 206 of the package carrier 204.

The package carrier 204 can have a bottom conductive connector 232 on a side of the package carrier 204 facing away from the integrated circuit 202. The bottom conductive connector 232 is defined as a connection interface for electrical connection to other components. The package carrier 204 can have a plurality of the bottom conductive connector 232 with a bottom gap 210 between each of the plurality of the bottom conductive connector 232.

The integrated circuit packaging system 100 can include the encapsulation 106 formed over the integrated circuit 202, the encapsulation 106 having a recess 212 exposing the conductive connector 108. The encapsulation 106 can include an encapsulation side 214. The encapsulation side 214 can represent a non-horizontal side of the encapsulation 106 facing away from the integrated circuit 202.

The recess 212 is defined as an indentation from a top surface 216 of the encapsulation 106. For example, the recess 212 can be formed by various methods, such as from protruded mode chase, mechanical or laser drilling, chemical etching with mask, or a combination thereof. For further example, the recess 212 can be formed with an obtuse angle from the top surface 216 of the encapsulation 106 to a top portion 218 of the conductive connector 108.

The integrated circuit packaging system 100 can include a thermal interface layer 220 over the integrated circuit 202. The thermal interface layer 220 is defined a structure of thermally conductive material. For example, the thermal interface layer 220 can dissipate heat away from the integrated circuit 202. The thermal interface layer 220 can include a layer topside 222. For example, the layer topside 222 can be coplanar with the top surface 216 of the encapsulation 106.

The integrated circuit packaging system 100 can include the heat slug 102 mounted over the encapsulation 106, the heat slug 102 having the opening 104 with an opening width 201 greater than a recess width 213 of the recess 212, the opening 104 exposing a portion 224 of the top surface 216 of the encapsulation 106. For example, the portion 224 can represent the top surface 216 of the encapsulation 106 exposed within the opening 104.

It has been discovered that the heat slug 102 having the opening 104 with the opening width 201 greater than the recess width 213 of the recess 212 allows additional mounting option for connecting signals to the next system level that otherwise be used for the heat dissipation path through the heat slug 102. The additional mounting option can improve the efficiency and performance of the integrated circuit packaging system 100 by allowing additional signal connection to the next system level.

The heat slug 102 can include a slug top 226, which is defined as a non-vertical portion of the heat slug 102. For example, the slug top 226 can include the opening 104. The heat slug 102 can include a sidewall 228, which is defined as a non-horizontal portion of the heat slug 102. The sidewall 228 can have a peripheral side 230. For example, the heat slug 102 can have the sidewall 228 in direct contact with the encapsulation side 214 and the carrier side 208. For another example, the sidewall 228 can extend beyond the encapsulation side 214 and the carrier side 208 for ground connection for the heat slug 102. For further example, the sidewall 228 can extend perpendicularly from the slug top 226 with the slug top 226 in direct contact with the top surface 216 of the encapsulation 106.

It has been discovered that the heat slug 102 having the sidewall 228 in direct contact with the encapsulation side 214 and the carrier side 208 improves the thermal performance of the integrated circuit packaging system 100. The sidewall 228 extending beyond the encapsulation side 214 and the carrier side 208 improves efficiency for heat dissipation for the integrated circuit 202 by increasing the contact area, thus, improving board level reliability and performance.

It has also been discovered that the sidewall 228 extending from the slug top 226 controls the standoff height of the integrated circuit packaging system 100, thus, improving the structural reliability of the integrated circuit packaging system 100. Additionally, the improvement of the structural reliability increases board level reliability and performance of the semiconductor device. Therefore, the thermally-enhanced package design of the present invention can be applied to various semiconductor devices, thus, lowering the production cost.

Figure 3A:
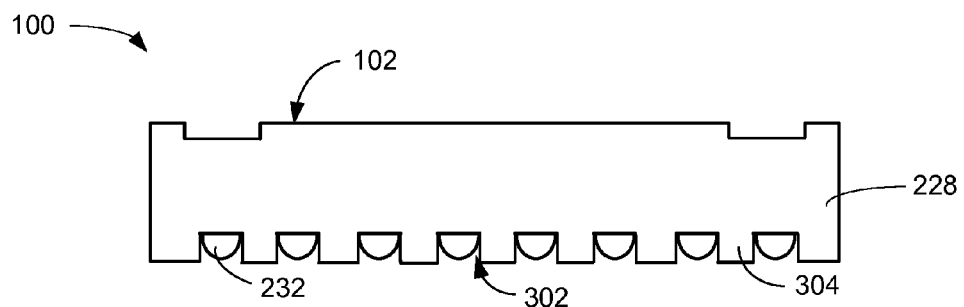
FIG. 3A is a first side view of the integrated circuit packaging system.

Referring now to FIG. 3A, therein is shown a first side view of the integrated circuit packaging system 100. The sidewall 228 can have a teeth gap 302 exposing the bottom conductive connector 232. The sidewall 228 can have a teeth extension 304 covering the bottom gap 210 of FIG. 1 between a plurality of the bottom conductive connector 232.

It has been discovered that the heat slug 102 having the sidewall 228 in direct contact with the encapsulation side 214 of FIG. 2 and the carrier side 208 of FIG. 2 improves the thermal performance of the integrated circuit packaging system 100. The sidewall 228 extending beyond the encapsulation side 214 and the carrier side 208 improves efficiency for heat dissipation for the integrated circuit 202 by increasing the contact area, thus, improving board level reliability and performance.

It has been further discovered the sidewall 228 having the teeth gap 302 that can expose the bottom conductive connector 232 and the teeth extension 304 covering the bottom gap 210 allows additional mounting option for connecting signals to the next system level that otherwise be used for the heat dissipation path through the heat slug 102. The additional mounting option can improve the efficiency and performance of the integrated circuit packaging system 100 by allowing additional signal connection to the next system level.

Figure 3B:
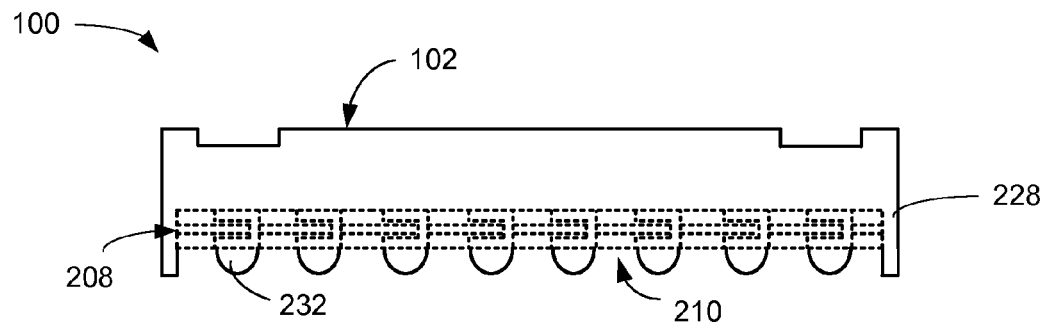
FIG. 3B is a second side view of the integrated circuit packaging system.

Referring now to FIG. 3B, therein is shown a second side view of the integrated circuit packaging system 100. For example, the sidewall 228 can cover the carrier side 208 but expose the bottom conductive connector 232, and the bottom gap 210. For another example, as illustrated by dotted lines, the sidewall 228 can cover the encapsulation side 214 but expose the carrier side 208, the bottom conductive connector 232, and the bottom gap 210.

It has been discovered that the heat slug 102 having the sidewall 228 in direct contact with the encapsulation side 214 of FIG. 2 and the carrier side 208 improves the thermal performance of the integrated circuit packaging system 100. The sidewall 228 extending beyond the encapsulation side 214 and the carrier side 208 improves efficiency for heat dissipation for the integrated circuit 202 by increasing the contact area, thus, improving board level reliability and performance.

It has been further discovered the sidewall 228 exposing the bottom conductive connector 232 and the bottom gap 210 allows additional mounting option for connecting signals to the next system level that otherwise be used for the heat dissipation path through the heat slug 102. The additional mounting option can improve the efficiency and performance of the integrated circuit packaging system 100 by allowing additional signal connection to the next system level.

Figure 3C:
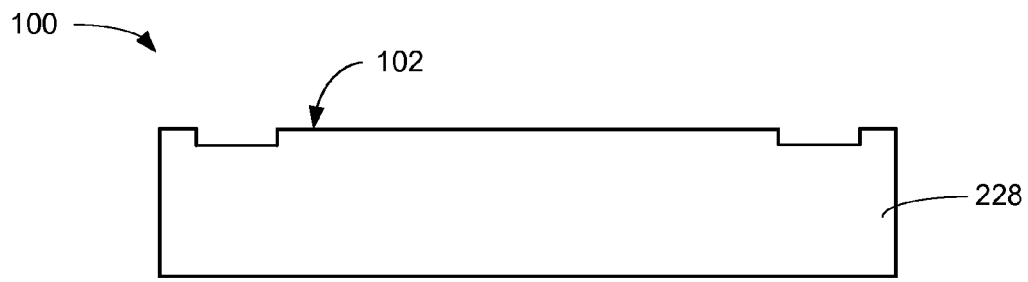
FIG. 3C is a third side view of the integrated circuit packaging system.

Referring now to FIG. 3C, therein is shown a third side view of the integrated circuit packaging system 100. For example, the sidewall 238 can cover the bottom conductive connector 232 and the bottom gap 210.

It has been discovered that the heat slug 102 having the sidewall 228 in direct contact with the encapsulation side 214 of FIG. 2 and the carrier side 208 of FIG. 2 improves the thermal performance of the integrated circuit packaging system 100. The sidewall 228 extending beyond the encapsulation side 214 and the carrier side 208 improves efficiency for heat dissipation for the integrated circuit 202 by increasing the contact area, thus, improving board level reliability and performance.

The examples for each variations of the sidewall 228 illustrated in FIG. 3A, FIG. 3B, and FIG. 3C can cover the integrated circuit packaging system 100 in various ways. For example, two sides of the integrated circuit packaging system 100 can have the sidewall 228 having the teeth gap 302 of FIG. 3A exposing the bottom conductive connector 232 and the teeth extension 304 of FIG. 3A covering the bottom gap 210. Further, another two sides of the integrated circuit packaging system 100 can have the sidewall 228 covering the bottom conductive connector 232 and the bottom gap 210 as illustrated in FIG. 3C.

For different example, two sides of the integrated circuit packaging system 100 can have the sidewall 228 covering the carrier side 208 but exposing the bottom conductive connector 232, and the bottom gap 210 as illustrated in FIG. 3B. Further, another two sides of the integrated circuit packaging system 100 can have the sidewall 228 exposing the carrier side 208, the bottom conductive connector 232, and the bottom gap 210 as illustrated in FIG. 3B.

Figure 4:
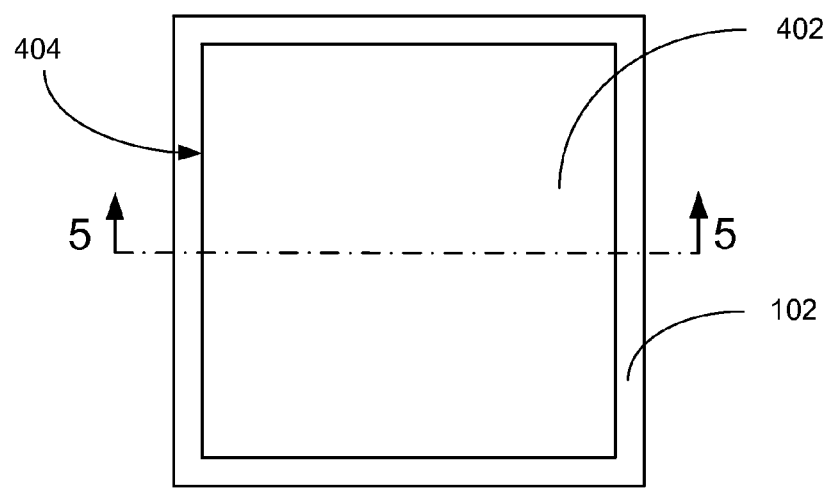
FIG. 4 is a top view of a stackable package mounted over the integrated circuit packaging system of FIG. 1.

Referring now to FIG. 4, therein is shown a top view of a stackable package 402 mounted over the integrated circuit packaging system 100 of FIG. 1. The stackable package 402 is defined as a packaged integrated circuit that can be mounted on other package or structures, or receive other packages. The stackable package 402 can be mounted over the heat slug 102. The stackable package 402 can include a package side 404, which is defined a non-horizontal side facing away from the integrated circuit 202 of FIG. 2.

Figure 5:
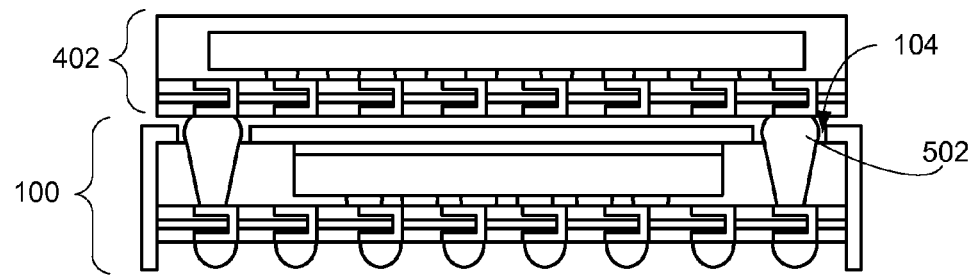
FIG. 5 is a cross-sectional view of the stackable package mounted over the integrated circuit packaging system along the line 5-5 of FIG. 4.

Referring now to FIG. 5, therein is shown a cross-sectional view of the stackable package 402 mounted over the integrated circuit packaging system 100 along the line 5-5 of FIG. 4. The stackable package 402 having a package conductive connector 502 can be stacked over the integrated circuit packaging system 100. The package conductive connector 502 is defined as a connection interface for electrical connection to other components.

For example, the stackable package 402 can be mounted over the integrated circuit packaging system 100 with the package conductive connector 502 mounted within the recess 212 of FIG. 2 and the opening 104. The recess 212 can be filled with the package conductive connector 502.

Figure 6:
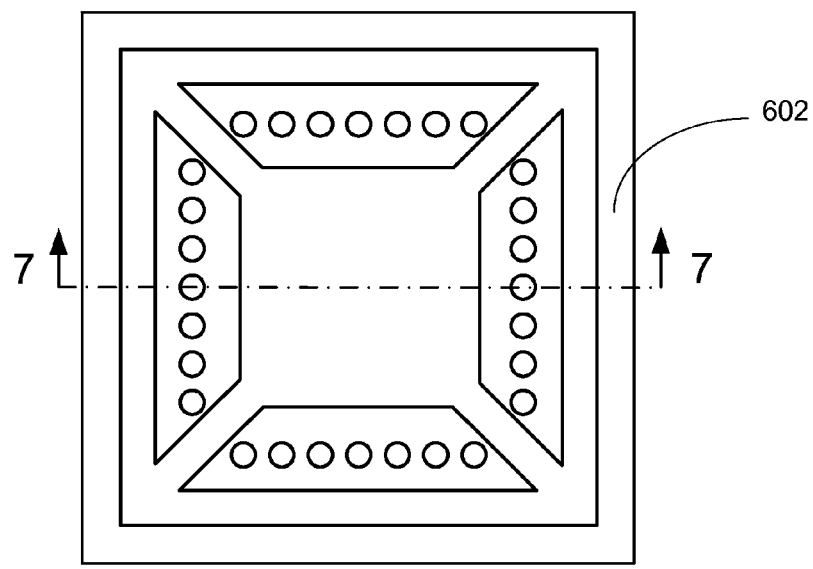
FIG. 6 is a top view of the integrated circuit packaging system over a mounting carrier.

Referring now to FIG. 6, therein is shown a top view of the integrated circuit packaging system 100 over a mounting carrier 602. The mounting carrier 602 is defined as a mounting structure for the integrated circuit 202 of FIG. 2 or other electrical components as well as providing electrical connections between, to, and from the devices mounted thereto.

Figure 7:
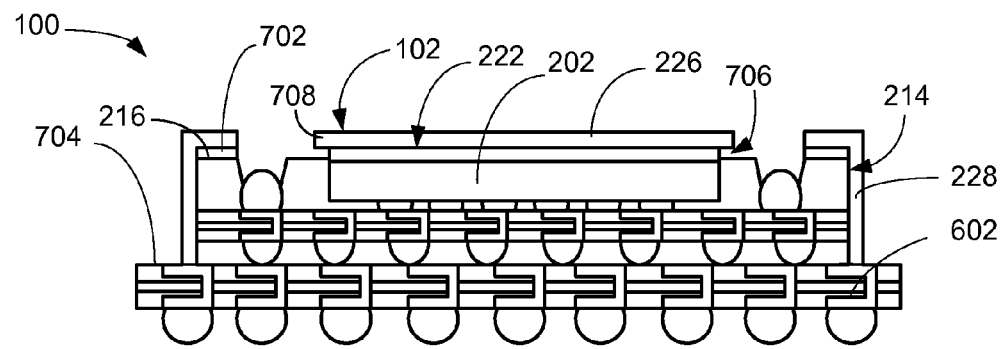
FIG. 7 is a cross-sectional view of the integrated circuit packaging system mounted over the mounting carrier along the line 7-7 of FIG. 6.

Referring now to FIG. 7, therein is shown a cross-sectional view of the integrated circuit packaging system 100 mounted over the mounting carrier 602 along the line 7-7 of FIG. 6. For example, the integrated circuit packaging system 100 can be mounted over a mounting side 704 of the mounting carrier 602. The mounting side 704 is defined as a non-vertical side of the mounting carrier 602 facing the integrated circuit packaging system 100.

It has been discovered that the heat slug 102 having the sidewall 228 in direct contact with the encapsulation side 214, the carrier side 208, and the mounting side 704 improves the thermal performance of the integrated circuit packaging system 100. The sidewall 228 extending beyond the encapsulation side 214 and the carrier side 208 to contact the mounting side 704 improves efficiency for heat dissipation for the integrated circuit 202 by increasing the contact area, thus, improving board level reliability and performance.

The integrated circuit packaging system 100 can include an adhesive 702 in direct contact with the slug top 226 and the sidewall 228 with a top extent of the adhesive 702 coplanar with the layer topside 222. The adhesive 702 is defined as a sticky material for holding components in place. For example, the adhesive 702 can include a resin, glue, paste, cement, putty, or a polyvinyl resin emulsion. The integrated circuit packaging system 100 can include a gap 706 between the slug top 226 and the top surface 216 of the encapsulation 106.

The slug top 226 can include an overhang 708. The overhang 708 can represent a non-vertical portion of the slug top 226 adjacent to the layer topside 222 and directly above the gap 706.

Figure 8:
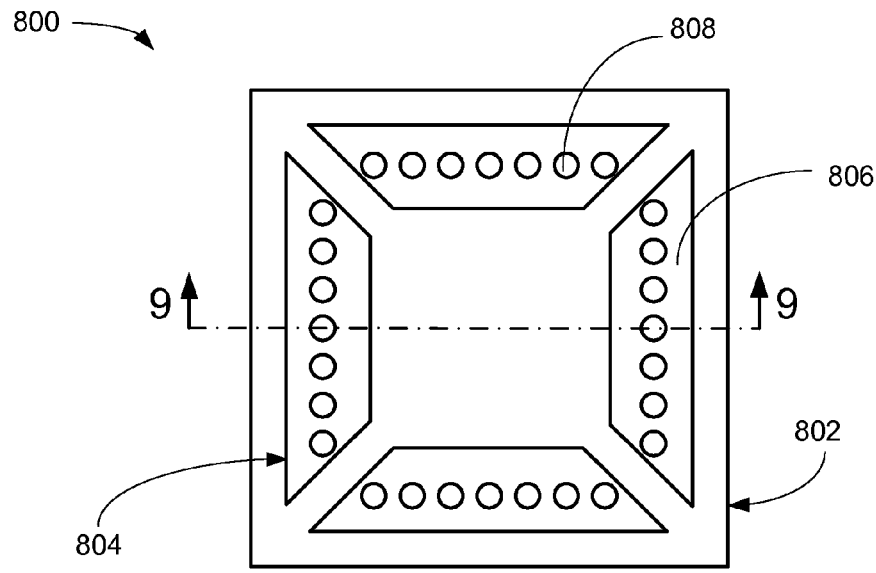
FIG. 8 is a top view of an integrated circuit packaging system in a second embodiment of the present invention

Referring now to FIG. 8, therein is shown a top view of an integrated circuit packaging system 800 in a second embodiment of the present invention. The integrated circuit packaging system 800 can include a heat slug 802, which is defined as a conductive structure that can transfer heat generated within the integrated circuit packaging system 800 to the external environment. The term "external" refers to outside the integrated circuit packaging system 800. The heat slug 802 can be a single integral structure having an opening 804.

An encapsulation 806 can be exposed within the opening 804. The encapsulation 806 is defined as a cover surrounding and protecting the contents in the integrated circuit packaging system 800 from the environment and hermetically seals the contents internal to the integrated circuit packaging system 800. The encapsulation 806 can include an epoxy molding or resin.

A conductive connector 808 can be exposed within the opening 804. The conductive connector 808 is defined as a connection interface for electrical connection to other components. For example, the conductive connector 808 can include a solder bump or a conductive bump.

For illustrative purposes, the integrated circuit packaging system 800 is shown having one row of the conductive connector 808 shown through the opening 804, although it is understood that the configuration for the conductive connector 808 can be different. For example, there can be multiple rows of the conductive connector 808 for shown in the opening 804 or different number of rows of the conductive connector 808 for the opening 804 along different sides of the integrated circuit packaging system 800.

Figure 9:
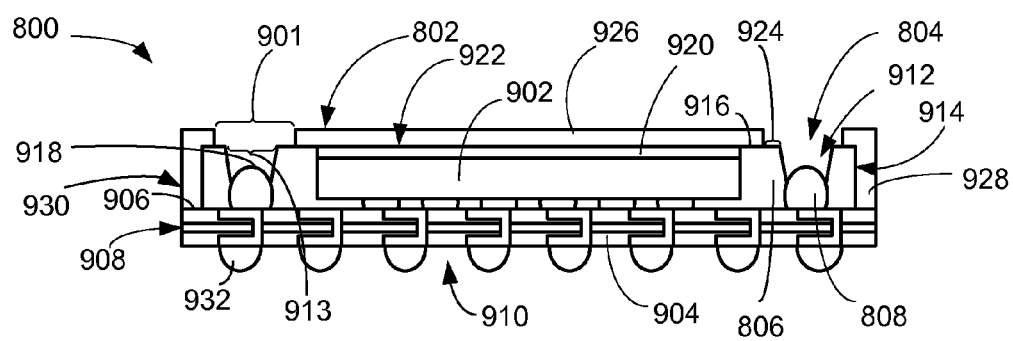
FIG. 9 is a cross-sectional view of the integrated circuit packaging system along the line 9-9 of FIG. 8

Referring now to FIG. 9, therein is shown a cross-sectional view of the integrated circuit packaging system 800 along the line 9-9 of FIG. 8. The integrated circuit packaging system 800 can include an integrated circuit 902 mounted over a package carrier 904. The integrated circuit 902 is defined as chip with active circuitry fabricated thereon. For example, the integrated circuit 902 can include a flip chip, a wire bonded chip, or a packaged integrated circuit. The package carrier 904 is defined as a mounting structure for the integrated circuit 902 or other electrical components as well as providing electrical connections between, to, and from the devices mounted thereto.

The package carrier 904 can include a component side 906 and a carrier side 908. The component side 906 can represent a non-vertical side of the package carrier 904 facing the integrated circuit 902. The carrier side 908 is defined as non-horizontal side of the package carrier 904 facing away from the integrated circuit 902. For example, the conductive connector 808 can be mounted over the component side 906 of the package carrier 904.

The package carrier 904 can have a bottom conductive connector 932 on a side of the package carrier 904 facing away from the integrated circuit 902. The bottom conductive connector 932 is defined as a connection interface for electrical connection to other components. The package carrier 904 can have a plurality of the bottom conductive connector 932 with a bottom gap 910 between each of the plurality of the bottom conductive connector 932.

The integrated circuit packaging system 800 can include the encapsulation 806 formed over the integrated circuit 902, the encapsulation 806 having a recess 912 exposing the conductive connector 808. The encapsulation 806 can include an encapsulation side 914. The encapsulation side 914 can represent a non-horizontal side of the encapsulation 806 facing away from the integrated circuit 902.

The recess 912 is defined as an indentation from a top surface 916 of the encapsulation 806. For example, the recess 912 can be formed by various methods, such as from protruded mode chase, mechanical or laser drilling, chemical etching with mask, or a combination thereof. For further example, the recess 912 can be formed with an obtuse angle from the top surface 916 of the encapsulation 806 to a top portion 918 of the conductive connector 808.

The integrated circuit packaging system 800 can include a thermal interface layer 920 over the integrated circuit 902. The thermal interface layer 920 is defined a structure of thermally conductive material. For example, the thermal interface layer 920 can dissipate heat away from the integrated circuit 902. The thermal interface layer 920 can include a layer topside 922. For example, the layer topside 922 can be coplanar with the top surface 916 of the encapsulation 806.

The integrated circuit packaging system 800 can include the heat slug 802 mounted over the encapsulation 806, the heat slug 802 having the opening 804 with an opening width 901 greater than a recess width 913 of the recess 912, the opening 804 exposing a portion 924 of the top surface 916 of the encapsulation 806. For example, the portion 924 can represent the top surface 916 of the encapsulation 806 exposed within the opening 804.

It has been discovered that the heat slug 802 having the opening 804 with the opening width 901 greater than the recess width 913 of the recess 912 allows additional mounting option for connecting signals to the next system level that otherwise be used for the heat dissipation path through the heat slug 802. The additional mounting option can improve the efficiency and performance of the integrated circuit packaging system 800 by allowing additional signal connection to the next system level.

The heat slug 802 can include a slug top 926, which is defined as a non-vertical portion of the heat slug 802. For example, the slug top 926 can include the opening 804. The heat slug 802 can include a sidewall 928, which is defined as a non-horizontal portion of the heat slug 802. The sidewall 928 can have a peripheral side 930. For example, the heat slug 802 can have the sidewall 928 in direct contact with the encapsulation side 914 and the component side 906. For further example, the sidewall 928 can extend perpendicularly from the slug top 926 with the slug top 926 in direct contact with the top surface 916 of the encapsulation 806.

It has been discovered that the heat slug 802 having the sidewall 928 in direct contact with the encapsulation side 914 and the component side 906 improves the thermal performance of the integrated circuit packaging system 800. The sidewall 928 extending beyond the encapsulation side 914 and the component side 906 improves efficiency for heat dissipation for the integrated circuit 902 by increasing the contact area, thus, improving board level reliability and performance.

Figure 10:
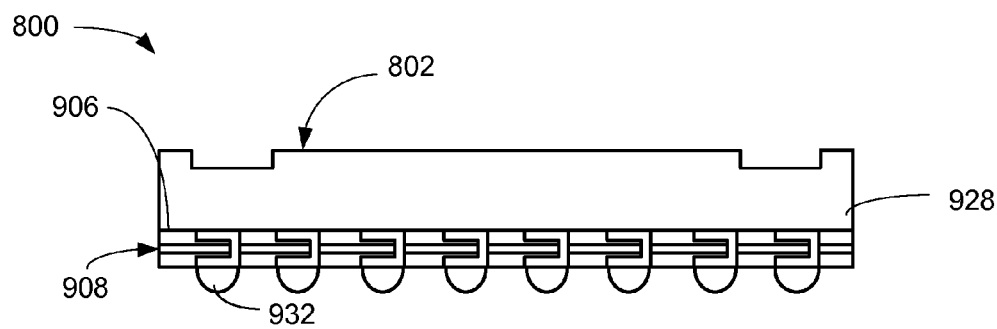
FIG. 10 is a side view of the integrated circuit packaging system.

Referring now to FIG. 10, therein is shown a side view of the integrated circuit packaging system 800. For example, the sidewall 928 can cover the encapsulation side 914 of FIG. 9 but expose the carrier side 908, the bottom conductive connector 932, and the bottom gap 910.

It has been discovered that the heat slug 802 having the sidewall 928 in direct contact with the encapsulation side 914 and the component side 906 improves the thermal performance of the integrated circuit packaging system 800. The sidewall 928 extending beyond the encapsulation side 914 improves efficiency for heat dissipation for the integrated circuit 902 by increasing the contact area, thus, improving board level reliability and performance.

It has been further discovered the heat slug 802 having the sidewall 928 that can expose the carrier side 908, the bottom conductive connector 932, and the bottom gap 910 allows additional mounting option for connecting signals to the next system level that otherwise be used for the heat dissipation path through the heat slug 802. The additional mounting option can improve the efficiency and performance of the integrated circuit packaging system 800 by allowing additional signal connection to the next system level.

Figure 11:
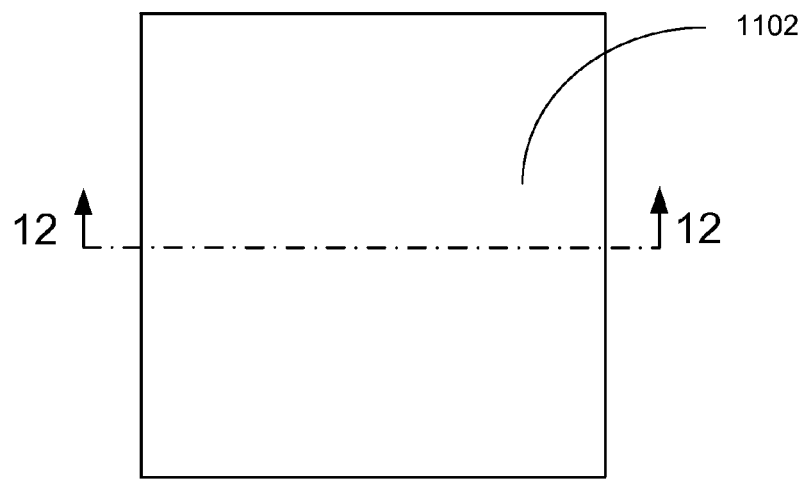
FIG. 11 is a top view of a stackable package.

Referring now to FIG. 11, therein is shown a top view of a stackable package 1102. The stackable package 1102 is defined as a packaged integrated circuit that can be mounted on other package or structures, or receive other packages.

Figure 12:
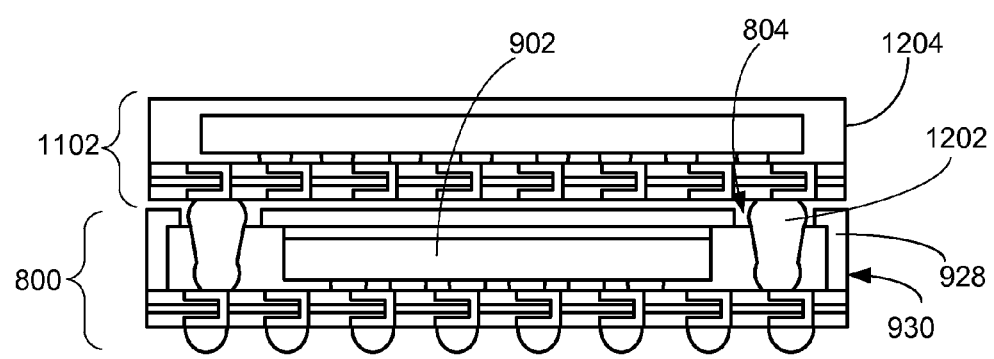
FIG. 12 is a cross-sectional view of the stackable package mounted over the integrated circuit packaging system along the line 12-12 of FIG. 11.

Referring now to FIG. 12, therein is shown a cross-sectional view of the stackable package 1102 mounted over the integrated circuit packaging system 800 along the line 12-12 of FIG. 11. The stackable package 1102 having a package conductive connector 1202 can be stacked over the integrated circuit packaging system 800. The package conductive connector 1202 is defined as a connection interface for electrical connection to other components.

For example, the stackable package 1102 can be mounted over the integrated circuit packaging system 800 with the package conductive connector 1202 mounted within the recess 912 of FIG. 9 and the opening 804. The recess 912 can be filled with the package conductive connector 1202. For another example, the stackable package 1102 having a package side 1204 coplanar with the peripheral side 930 of the sidewall 928. The package side 1204 is defined as a non-horizontal side facing away from the integrated circuit 902.

Figure 13:
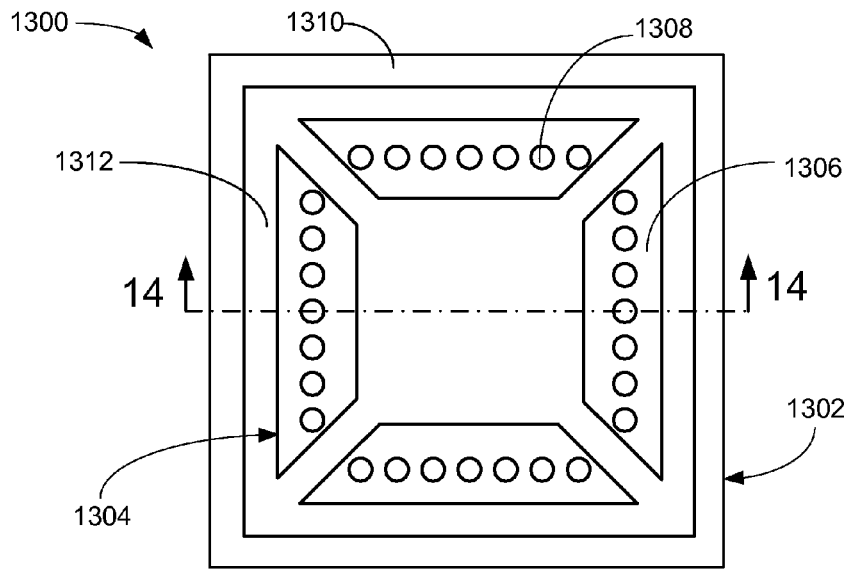
FIG. 13 is a top view of an integrated circuit packaging system in a third embodiment of the present invention.

Referring now to FIG. 13, therein is shown a top view of an integrated circuit packaging system 1300 in a third embodiment of the present invention. The integrated circuit packaging system 1300 can include a heat slug 1302, which is defined as a conductive structure that can transfer heat generated within the integrated circuit packaging system 1300 to the external environment. The term "external" refers to outside the integrated circuit packaging system 1300. The heat slug 1302 can be a single integral structure having an opening 1304.

The heat slug 1302 can also include a sidewall 1312 having a step 1310. The sidewall 1312 is defined as a non-horizontal portion of the heat slug 1302. The step 1310 is defined as a non-vertical portion of the sidewall 1312.

An encapsulation 1306 can be exposed within the opening 1304. The encapsulation 1306 is defined as a cover surrounding and protecting the contents in the integrated circuit packaging system 1300 from the environment and hermetically seals the contents internal to the integrated circuit packaging system 1300. The encapsulation 1306 can include an epoxy molding or resin.

A conductive connector 1308 can be exposed within the opening 1304. The conductive connector 1308 is defined as a connection interface for electrical connection to other components. For example, the conductive connector 1308 can include a solder bump or a conductive bump.

For illustrative purposes, the integrated circuit packaging system 1300 is shown having one row of the conductive connector 1308 shown through the opening 1304, although it is understood that the configuration for the conductive connector 1308 can be different. For example, there can be multiple rows of the conductive connector 1308 for shown in the opening 1304 or different number of rows of the conductive connector 1308 for the opening 1304 along different sides of the integrated circuit packaging system 1300.

Figure 14:
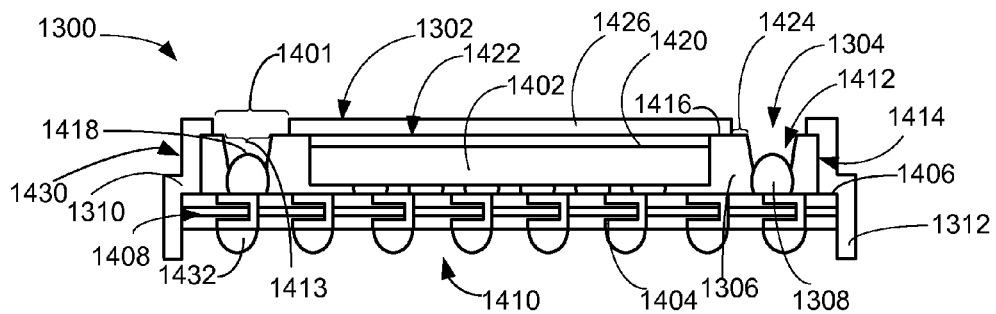
FIG. 14 is a cross-sectional view of the integrated circuit packaging system along the line 14-14 of FIG. 13.

Referring now to FIG. 14, therein is shown a cross-sectional view of the integrated circuit packaging system 1300 along the line 14-14 of FIG. 13. The integrated circuit packaging system 1300 can include an integrated circuit 1402 mounted over a package carrier 1404. The integrated circuit 1402 is defined as chip with active circuitry fabricated thereon. For example, the integrated circuit 1402 can include a flip chip, a wire bonded chip, or a packaged integrated circuit. The package carrier 1404 is defined as a mounting structure for the integrated circuit 1402 or other electrical components as well as providing electrical connections between, to, and from the devices mounted thereto.

The package carrier 1404 can include a component side 1406 and a carrier side 1408. The component side 1406 can represent a non-vertical side of the package carrier 1404 facing the integrated circuit 1402. The carrier side 1408 is defined as non-horizontal side of the package carrier 1404 facing away from the integrated circuit 1402. For example, the conductive connector 1308 can be mounted over the component side 1406 of the package carrier 1404.

The package carrier 1404 can have a bottom conductive connector 1432 on a side of the package carrier 1404 facing away from the integrated circuit 1402. The bottom conductive connector 1432 is defined as a connection interface for electrical connection to other components. The package carrier 1404 can have a plurality of the bottom conductive connector 1432 with a bottom gap 1410 between each of the plurality of the bottom conductive connector 1432.

The integrated circuit packaging system 1300 can include the encapsulation 1306 formed over the integrated circuit 1402, the encapsulation 1306 having a recess 1412 exposing the conductive connector 1308. The encapsulation 1306 can include an encapsulation side 1414. The encapsulation side 1414 can represent a non-horizontal side of the encapsulation 1306 facing away from the integrated circuit 1402.

The recess 1412 is defined as an indentation from a top surface 1416 of the encapsulation 1306. For example, the recess 1412 can be formed by various methods, such as from protruded mode chase, mechanical or laser drilling, chemical etching with mask, or a combination thereof. For further example, the recess 1412 can be formed with an obtuse angle from the top surface 1416 of the encapsulation 1306 to a top portion 1418 of the conductive connector 1308.

The integrated circuit packaging system 1300 can include a thermal interface layer 1420 over the integrated circuit 1402. The thermal interface layer 1420 is defined a structure of thermally conductive material. For example, the thermal interface layer 1420 can dissipate heat away from the integrated circuit 1402. The thermal interface layer 1420 can include a layer topside 1422. For example, the layer topside 1422 can be coplanar with the top surface 1416 of the encapsulation 1306.

The integrated circuit packaging system 1300 can include the heat slug 1302 mounted over the encapsulation 1306, the heat slug 1302 having the opening 1304 with an opening width 1401 greater than a recess width 1413 of the recess 1412, the opening 1304 exposing a portion 1424 of the top surface 1416 of the encapsulation 1306. For example, the portion 1424 can represent the top surface 1416 of the encapsulation 1306 exposed within the opening 1304.

It has been discovered that the heat slug 1302 having the opening 1304 with the opening width 1401 greater than the recess width 1413 of the recess 1412 allows additional mounting option for connecting signals to the next system level that otherwise be used for the heat dissipation path through the heat slug 1302. The additional mounting option can improve the efficiency and performance of the integrated circuit packaging system 1300 by allowing additional signal connection to the next system level.

The heat slug 1302 can include a slug top 1426, which is defined as a non-vertical portion of the heat slug 1302. For example, the slug top 1426 can include the opening 1304. For example, the heat slug 1302 can have the sidewall 1312 in direct contact with the encapsulation side 1414 and the carrier side 1408. The sidewall 1312 can have a peripheral side 1430. The heat slug 1302 can have the step 1310 in direct contact with the component side 1406. For another example, the sidewall 1312 can extend beyond the encapsulation side 1414 and the carrier side 1408 for ground connection for the heat slug 1302. For further example, the sidewall 1312 can extend perpendicularly from the slug top 1426 with the slug top 1426 in direct contact with the top surface 1416 of the encapsulation 1306.

It has been discovered that the heat slug 1302 having the sidewall 1312 in direct contact with the encapsulation side 1414, the component side 1406, and the carrier side 1408 improves the thermal performance of the integrated circuit packaging system 1300. The sidewall 1312 extending beyond the encapsulation side 1414, the component side 1406, and the carrier side 1408 improves efficiency for heat dissipation for the integrated circuit 1402 by increasing the contact area, thus, improving board level reliability and performance.

It has also been discovered that the sidewall 1312 extending from the slug top 1426 controls the standoff height of the integrated circuit packaging system 1300, thus, improving the structural reliability of the integrated circuit packaging system 1300. Additionally, the improvement of the structural reliability increases board level reliability and performance of the semiconductor device. Therefore, the thermally-enhanced package design of the present invention can be applied to various semiconductor devices, thus, lowering the production cost.

Figure 15A:
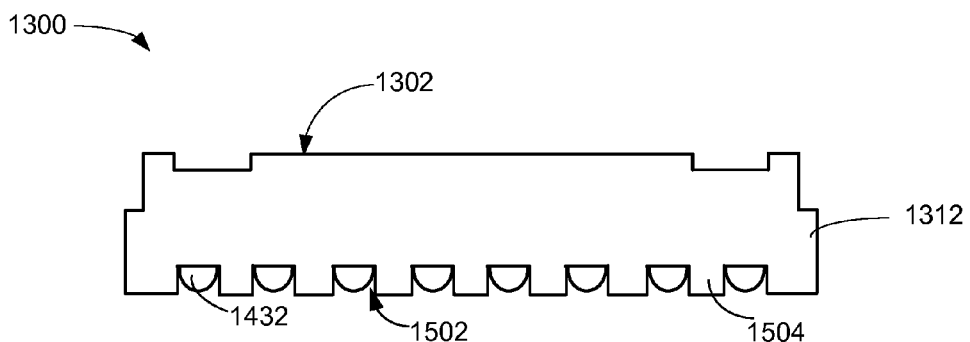
FIG. 15A is a first side view of the integrated circuit packaging system.

Referring now to FIG. 15A, therein is shown a first side view of the integrated circuit packaging system 1300. The sidewall 1312 can have a teeth gap 1502 exposing the bottom conductive connector 1432. The sidewall 1312 can have a teeth extension 1504 covering the bottom gap 1410 of FIG. 14 between a plurality of the bottom conductive connector 1432.

It has been discovered that the heat slug 1302 having the sidewall 1312 in direct contact with the encapsulation side 1414 of FIG. 14 and the carrier side 1408 of FIG. 14 improves the thermal performance of the integrated circuit packaging system 1300. The sidewall 1312 extending beyond the encapsulation side 1414 and the carrier side 1408 improves efficiency for heat dissipation for the integrated circuit 1402 of FIG. 14 by increasing the contact area, thus, improving board level reliability and performance.

It has been further discovered the sidewall 1312 having the teeth gap 1502 that can expose the bottom conductive connector 1432 and the teeth extension 1504 covering the bottom gap 1410 allows additional mounting option for connecting signals to the next system level that otherwise be used for the heat dissipation path through the heat slug 1302. The additional mounting option can improve the efficiency and performance of the integrated circuit packaging system 1300 by allowing additional signal connection to the next system level.

Figure 15B:
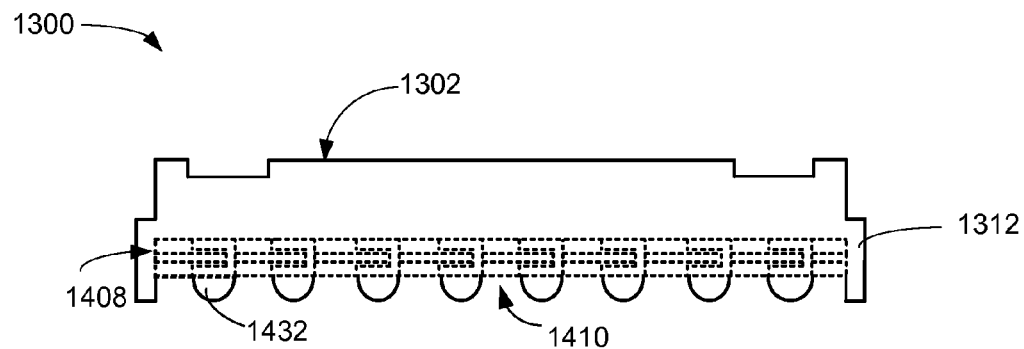
FIG. 15B is a second side view of the integrated circuit packaging system.

Referring now to FIG. 15B, therein is shown a second side view of the integrated circuit packaging system 1300. For example, the sidewall 1312 can cover the carrier side 1408 but expose the bottom conductive connector 1432, and the bottom gap 1410. For another example, as illustrated by dotted lines, the sidewall 1312 can cover the encapsulation side 1414 but expose the carrier side 1408, the bottom conductive connector 1432, and the bottom gap 1410.

It has been discovered that the heat slug 1302 having the sidewall 1312 in direct contact with the encapsulation side 1414 of FIG. 14 and the carrier side 1408 improves the thermal performance of the integrated circuit packaging system 1300. The sidewall 1312 extending beyond the encapsulation side 1414 and the carrier side 1408 improves efficiency for heat dissipation for the integrated circuit 1402 by increasing the contact area, thus, improving board level reliability and performance.

It has been further discovered the sidewall 1312 exposing the bottom conductive connector 1432 and the bottom gap 1410 allows additional mounting option for connecting signals to the next system level that otherwise be used for the heat dissipation path through the heat slug 1302. The additional mounting option can improve the efficiency and performance of the integrated circuit packaging system 1300 by allowing additional signal connection to the next system level.

Figure 15C:
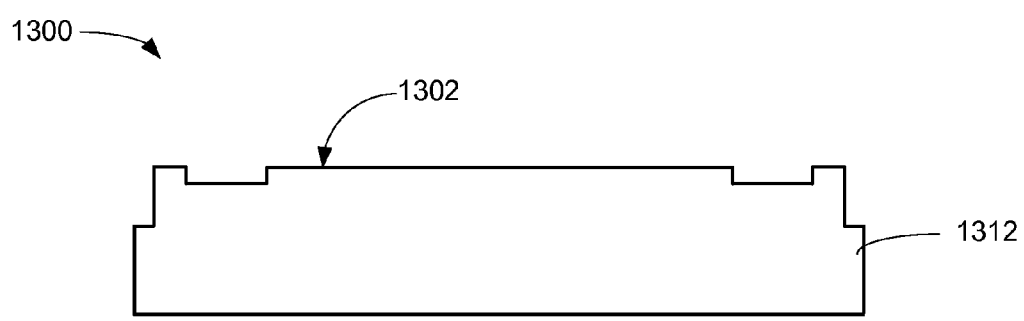
FIG. 15C is a third side view of the integrated circuit packaging system.

Referring now to FIG. 15C, therein is shown a third side view of the integrated circuit packaging system 1300. For example, the sidewall 1312 can cover the bottom conductive connector 1432, and the bottom gap 1410.

It has been discovered that the heat slug 1302 having the sidewall 1312 in direct contact with the encapsulation side 1414 of FIG. 14 and the carrier side 1408 improves the thermal performance of the integrated circuit packaging system 1300. The sidewall 1312 extending beyond the encapsulation side 1414 and the carrier side 1408 improves efficiency for heat dissipation for the integrated circuit 1402 by increasing the contact area, thus, improving board level reliability and performance.

The examples for each variations of the sidewall 1312 illustrated in FIG. 15A, FIG. 15B, and FIG. 15C can cover the integrated circuit packaging system 1300 in various ways. For example, two sides of the integrated circuit packaging system 1300 can have the sidewall 1312 having the teeth gap 1502 of FIG. 15A exposing the bottom conductive connector 1432 and the teeth extension 1504 of FIG. 15A covering the bottom gap 1410. Further, another two sides of the integrated circuit packaging system 1300 can have the sidewall 1312 covering the bottom conductive connector 1432 and the bottom gap 1410 as illustrated in FIG. 15C.

For different example, two sides of the integrated circuit packaging system 1300 can have the sidewall 1312 covering the carrier side 1408 but exposing the bottom conductive connector 1432, and the bottom gap 1410 as illustrated in FIG. 15B. Further, another two sides of the integrated circuit packaging system 1300 can have the sidewall 1312 exposing the carrier side 1408, the bottom conductive connector 1432, and the bottom gap 1410 as illustrated in FIG. 15B.

Figure 16:
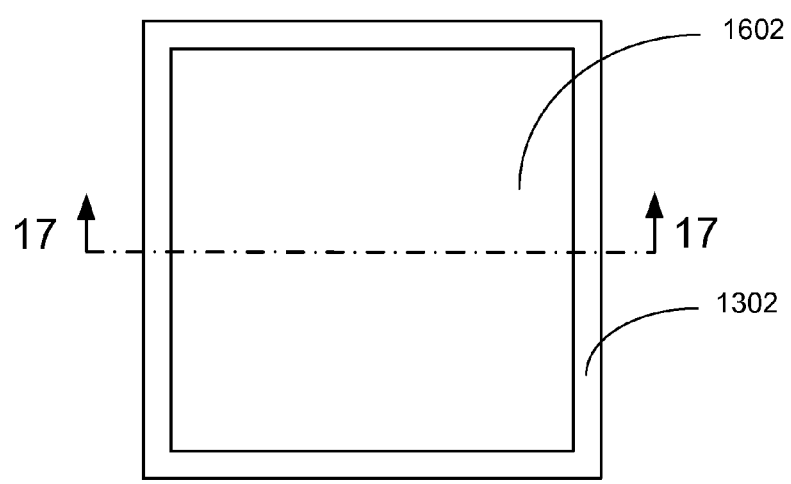
FIG. 16 is a top view of a stackable package mounted over the integrated circuit packaging system of FIG. 13.

Referring now to FIG. 16, therein is shown a top view of a stackable package 1602 mounted over the integrated circuit packaging system 1300 of FIG. 13. The stackable package 1602 is defined as a packaged integrated circuit that can be mounted on other package or structures, or receive other packages. The stackable package 1602 can be mounted over the heat slug 1302.

Figure 17:
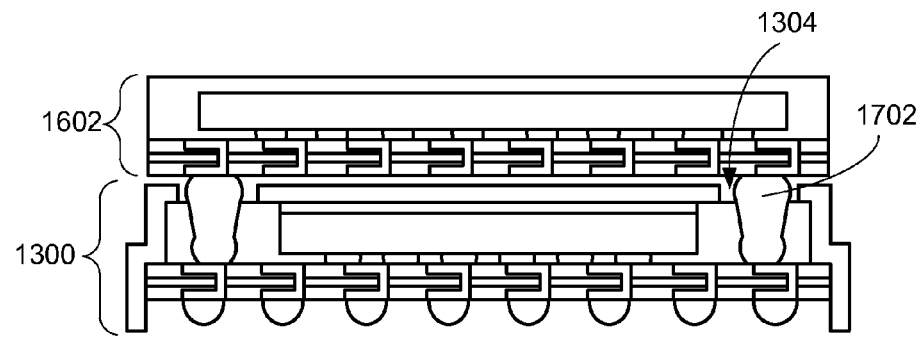
FIG. 17 is a cross-sectional view of the stackable package mounted over the integrated circuit packaging system along the line 17-17 of FIG. 16.

Referring now to FIG. 17, therein is shown a cross-sectional view of the stackable package 1602 mounted over the integrated circuit packaging system 1300 along the line 17-17 of FIG. 16. The stackable package 1602 having a package conductive connector 1702 can be stacked over the integrated circuit packaging system 1300. The package conductive connector 1702 is defined as a connection interface for electrical connection to other components.

For example, the stackable package 1602 can be mounted over the integrated circuit packaging system 1300 with the package conductive connector 1702 mounted within the recess 1412 of FIG. 2 and the opening 1304. The recess 1412 can be filled with the package conductive connector 1702.

Figure 18:
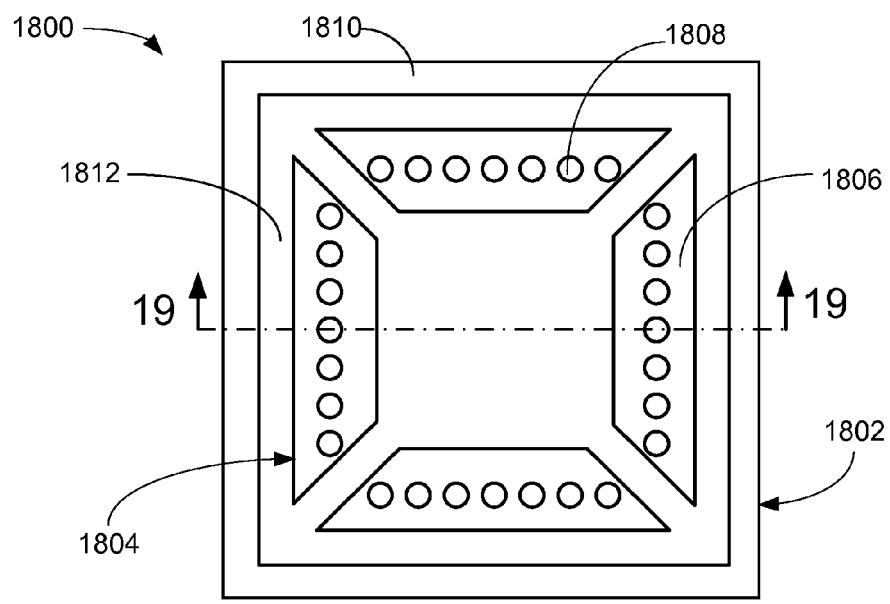
FIG. 18 is a top view of an integrated circuit packaging system in a fourth embodiment of the present invention.

Referring now to FIG. 18, therein is shown a top view of an integrated circuit packaging system 1800 in a fourth embodiment of the present invention. The integrated circuit packaging system 1800 can include a heat slug 1802, which is defined as a conductive structure that can transfer heat generated within the integrated circuit packaging system 1800 to the external environment. The term "external" refers to outside the integrated circuit packaging system 1800. The heat slug 1802 can be a single integral structure having an opening 1804.

The heat slug 1802 can also include a sidewall 1812 having a step 1810. The sidewall 1812 is defined as a non-horizontal portion of the heat slug 1802. The step 1810 is defined as a non-vertical portion of the sidewall 1812.

An encapsulation 1806 can be exposed within the opening 1804. The encapsulation 1806 is defined as a cover surrounding and protecting the contents in the integrated circuit packaging system 1800 from the environment and hermetically seals the contents internal to the integrated circuit packaging system 1800. The encapsulation 1806 can include an epoxy molding or resin.

A conductive connector 1808 can be exposed within the opening 1804. The conductive connector 1808 is defined as a connection interface for electrical connection to other components. For example, the conductive connector 1808 can include a solder bump or a conductive bump.

For illustrative purposes, the integrated circuit packaging system 1800 is shown having one row of the conductive connector 1808 shown through the opening 1804, although it is understood that the configuration for the conductive connector 1808 can be different. For example, there can be multiple rows of the conductive connector 1808 for shown in the opening 1804 or different number of rows of the conductive connector 1808 for the opening 1804 along different sides of the integrated circuit packaging system 1800.

Figure 19:
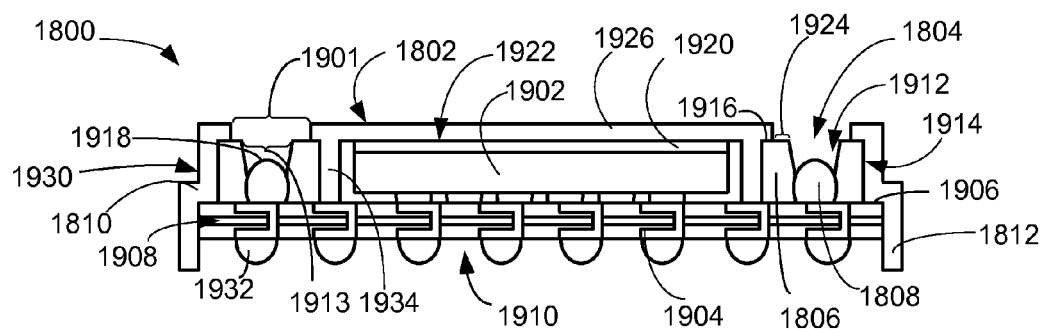
FIG. 19 is a cross-sectional view of the integrated circuit packaging system along the line 19-19 of FIG. 18.

Referring now to FIG. 19, therein is shown a cross-sectional view of the integrated circuit packaging system 1800 along the line 19-19 of FIG. 18. The integrated circuit packaging system 1800 can include an integrated circuit 1902 mounted over a package carrier 1904. The integrated circuit 1902 is defined as chip with active circuitry fabricated thereon. For example, the integrated circuit 1902 can include a flip chip, a wire bonded chip, or a packaged integrated circuit. The package carrier 1904 is defined as a mounting structure for the integrated circuit 1902 or other electrical components as well as providing electrical connections between, to, and from the devices mounted thereto.

The package carrier 1904 can include a component side 1906 and a carrier side 1908. The component side 1906 can represent a non-vertical side of the package carrier 1904 facing the integrated circuit 1902. The carrier side 1908 is defined as non-horizontal side of the package carrier 1904 facing away from the integrated circuit 1902. For example, the conductive connector 1808 can be mounted over the component side 1906 of the package carrier 1904.

The package carrier 1904 can have a bottom conductive connector 1932 on a side of the package carrier 1904 facing away from the integrated circuit 1902. The bottom conductive connector 1932 is defined as a connection interface for electrical connection to other components. The package carrier 1904 can have a plurality of the bottom conductive connector 1932 with a bottom gap 1910 between each of the plurality of the bottom conductive connector 1932.

The integrated circuit packaging system 1800 can include the encapsulation 1806 formed over the integrated circuit 1902, the encapsulation 1806 having a recess 1912 exposing the conductive connector 1808. The encapsulation 1806 can include an encapsulation side 1914. The encapsulation side 1914 can represent a non-horizontal side of the encapsulation 1806 facing away from the integrated circuit 1902.

The recess 1912 is defined as an indentation from a top surface 1916 of the encapsulation 1806. For example, the recess 1912 can be formed by various methods, such as from protruded mode chase, mechanical or laser drilling, chemical etching with mask, or a combination thereof. For further example, the recess 1912 can be formed with an obtuse angle from the top surface 1916 of the encapsulation 1806 to a top portion 1918 of the conductive connector 1808 conductive connector 1808 conductive connector 1808.

The integrated circuit packaging system 1800 can include a thermal interface layer 1920 over the integrated circuit 1902. The thermal interface layer 1920 is defined a structure of thermally conductive material. For example, the thermal interface layer 1920 can dissipate heat away from the integrated circuit 1902. The thermal interface layer 1920 can include a layer topside 1922. For example, the layer topside 1922 can be coplanar with the top surface 1916 of the encapsulation 1806.

The integrated circuit packaging system 1800 can include the heat slug 1802 mounted over the encapsulation 1806, the heat slug 1802 having the opening 1804 with an opening width 1901 greater than a recess width 1913 of the recess 1912, the opening 1804 exposing a portion 1924 of the top surface 1916 of the encapsulation 1806. For example, the portion 1924 can represent the top surface 1916 of the encapsulation 1806 exposed within the opening 1804.

It has been discovered that the heat slug 1802 having the opening 1804 with the opening width 1901 greater than the recess width 1913 of the recess 1912 allows additional mounting option for connecting signals to the next system level that otherwise be used for the heat dissipation path through the heat slug 1802. The additional mounting option can improve the efficiency and performance of the integrated circuit packaging system 1800 by allowing additional signal connection to the next system level.

The heat slug 1802 can include a slug top 1926, which is defined as a non-vertical portion of the heat slug 1802. For example, the slug top 1926 can include the opening 1804. For example, the heat slug 1802 can have the sidewall 1812 in direct contact with the encapsulation side 1914 and the carrier side 1908. The sidewall 1812 can have a peripheral side 1930. The heat slug 1802 can have the step 1810 in direct contact with the component side 1906. For another example, the sidewall 1812 can extend the encapsulation side 1914 and the carrier side 1908 for ground connection for the heat slug 1802. For further example, the sidewall 1812 can extend perpendicularly from the slug top 1926 with the slug top 1926 in direct contact with the top surface 1916 of the encapsulation 1806.

The heat slug 1802 can include an inner leg 1934, which is defined as a thermally conductive non-horizontal structure mounted between the conductive connector 1808 and the integrated circuit 1902 over the component side 1906. For example, the heat slug 1802 and the inner leg 1934 can be a single integral structure. For another example, the heat slug 1802 and the inner leg 1934 can be separate structures. For specific example, the inner leg 1934 can include a copper post, solder post, or a conductive post.

It has been discovered that the heat slug 1802 having the sidewall 1812 in direct contact with the encapsulation side 1914, the component side 1906, and the carrier side 1908 improves the thermal performance of the integrated circuit packaging system 1800. The sidewall 1812 extending beyond the encapsulation side 1914, the component side 1906, and the carrier side 1908 improves efficiency for heat dissipation for the integrated circuit 1902 by increasing the contact area, thus, improving board level reliability and performance.

It has been further discovered that the heat slug 1802 having the inner leg 1934 in direct contact with the component side 1906 improves the thermal performance of the integrated circuit packaging system 1800. The inner leg 1934 contacting the component side 1906 improves efficiency for heat dissipation for the integrated circuit 1902 by increasing the contact area, thus, improving board level reliability and performance.

It has also been discovered that the sidewall 1812 extending from the slug top 1926 controls the standoff height of the integrated circuit packaging system 1800, thus, improving the structural reliability of the integrated circuit packaging system 1800. Additionally, the improvement of the structural reliability increases board level reliability and performance of the semiconductor device. Therefore, the thermally-enhanced package design of the present invention can be applied to various semiconductor devices, thus, lowering the production cost.

Figure 20A:
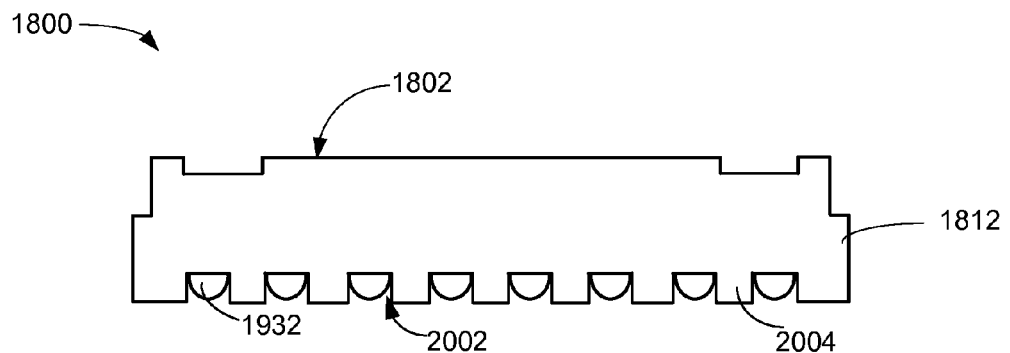
FIG. 20A is a first side view of the integrated circuit packaging system.

Referring now to FIG. 20A, therein is shown a first side view of the integrated circuit packaging system 1800. The sidewall 1812 can have a teeth gap 2002 exposing the bottom conductive connector 1932. The sidewall 1812 can have a teeth extension 2004 covering the bottom gap 1910 of FIG. 19 between a plurality of the bottom conductive connector 1932.

It has been discovered that the heat slug 1802 having the sidewall 1812 in direct contact with the encapsulation side 1914 of FIG. 19 and the carrier side 1908 of FIG. 19 improves the thermal performance of the integrated circuit packaging system 1800. The sidewall 1812 extending beyond the encapsulation side 1914 and the carrier side 1908 improves efficiency for heat dissipation for the integrated circuit 1902 of FIG. 19 by increasing the contact area, thus, improving board level reliability and performance.

It has been further discovered the sidewall 1812 having the teeth gap 2002 that can expose the bottom conductive connector 1932 and the teeth extension 2004 covering the bottom gap 1910 allows additional mounting option for connecting signals to the next system level that otherwise be used for the heat dissipation path through the heat slug 1802. The additional mounting option can improve the efficiency and performance of the integrated circuit packaging system 1800 by allowing additional signal connection to the next system level.

Figure 20B:
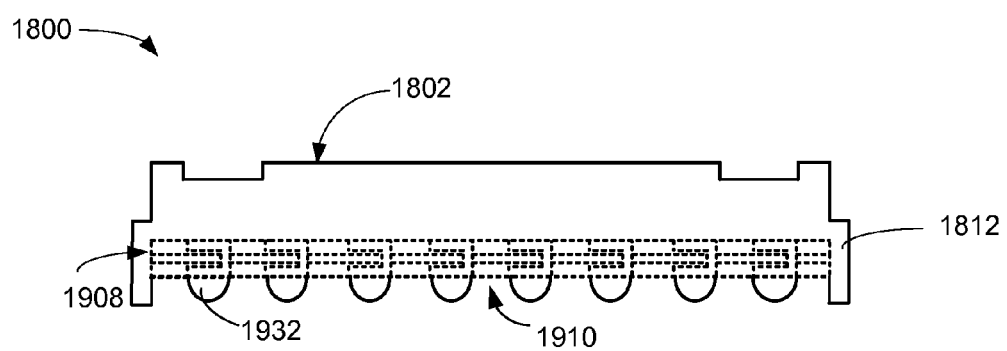
FIG. 20B is a second side view of the integrated circuit packaging system.

Referring now to FIG. 20B, therein is shown a second side view of the integrated circuit packaging system 1800. For example, the sidewall 1812 can cover the carrier side 1908 but expose the bottom conductive connector 1932, and the bottom gap 1910. For another example, as illustrated by dotted lines, the sidewall 1812 can cover the encapsulation side 1914 but expose the carrier side 1908, the bottom conductive connector 1932, and the bottom gap 1910.

It has been discovered that the heat slug 1802 having the sidewall 1812 in direct contact with the encapsulation side 1914 of FIG. 19 and the carrier side 1908 improves the thermal performance of the integrated circuit packaging system 1800. The sidewall 1812 extending beyond the encapsulation side 1914 and the carrier side 1908 improves efficiency for heat dissipation for the integrated circuit 1902 by increasing the contact area, thus, improving board level reliability and performance.

It has been further discovered the sidewall 1812 exposing the bottom conductive connector 1932 and the bottom gap 1910 allows additional mounting option for connecting signals to the next system level that otherwise be used for the heat dissipation path through the heat slug 1802. The additional mounting option can improve the efficiency and performance of the integrated circuit packaging system 1800 by allowing additional signal connection to the next system level.

Figure 20C:
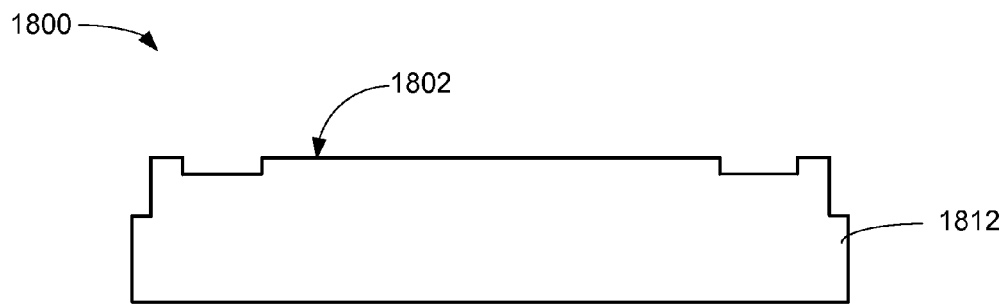
FIG. 20C is a third side view of the integrated circuit packaging system.

Referring now to FIG. 20C, therein is shown a third side view of the integrated circuit packaging system 1800. For example, the sidewall 1812 can cover the bottom conductive connector 1932, and the bottom gap 1910.

It has been discovered that the heat slug 1802 having the sidewall 1812 in direct contact with the encapsulation side 1914 of FIG. 19 and the carrier side 1908 improves the thermal performance of the integrated circuit packaging system 1800. The sidewall 1812 extending beyond the encapsulation side 1914 and the carrier side 1908 improves efficiency for heat dissipation for the integrated circuit 1902 by increasing the contact area, thus, improving board level reliability and performance.

The examples for each variations of the sidewall 1812 illustrated in FIG. 20A, FIG. 20B, and FIG. 20C can cover the integrated circuit packaging system 1800 in various ways. For example, two sides of the integrated circuit packaging system 1800 can have the sidewall 1812 having the teeth gap 2002 of FIG. 20A exposing the bottom conductive connector 1932 and the teeth extension 2004 of FIG. 20A covering the bottom gap 1910. Further, another two sides of the integrated circuit packaging system 1800 can have the sidewall 1812 covering the bottom conductive connector 1932 and the bottom gap 1910 as illustrated in FIG. 20C.

For different example, two sides of the integrated circuit packaging system 1800 can have the sidewall 1812 covering the carrier side 1908 but exposing the bottom conductive connector 1932, and the bottom gap 1910 as illustrated in FIG. 20B. Further, another two sides of the integrated circuit packaging system 1800 can have the sidewall 1812 exposing the carrier side 1908, the bottom conductive connector 1932, and the bottom gap 1910 as illustrated in FIG. 20B.

Figure 21:
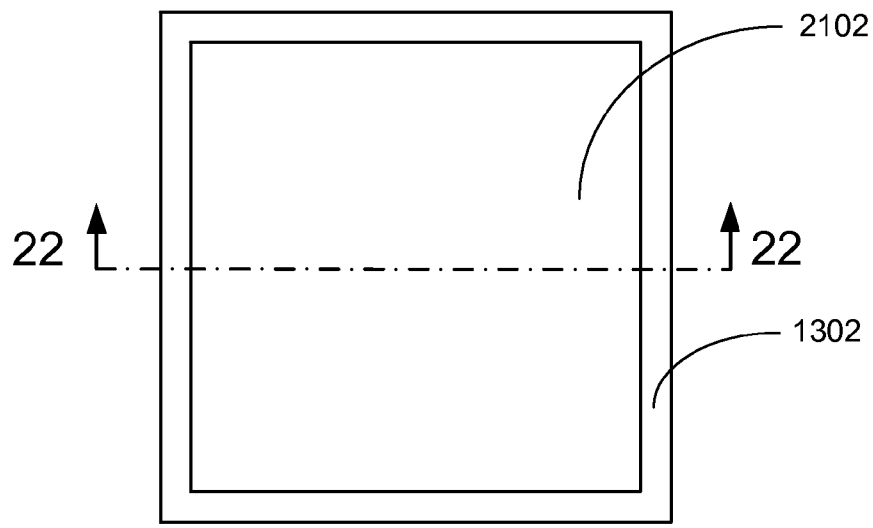
FIG. 21 is a top view of a stackable package mounted over the integrated circuit packaging system of FIG. 18.

Referring now to FIG. 21, therein is shown a top view of a stackable package 2102 mounted over the integrated circuit packaging system 1800 of FIG. 18. The stackable package 2102 is defined as a packaged integrated circuit that can be mounted on other package or structures, or receive other packages. The stackable package 2102 can be mounted over the heat slug 1302.

Figure 22:
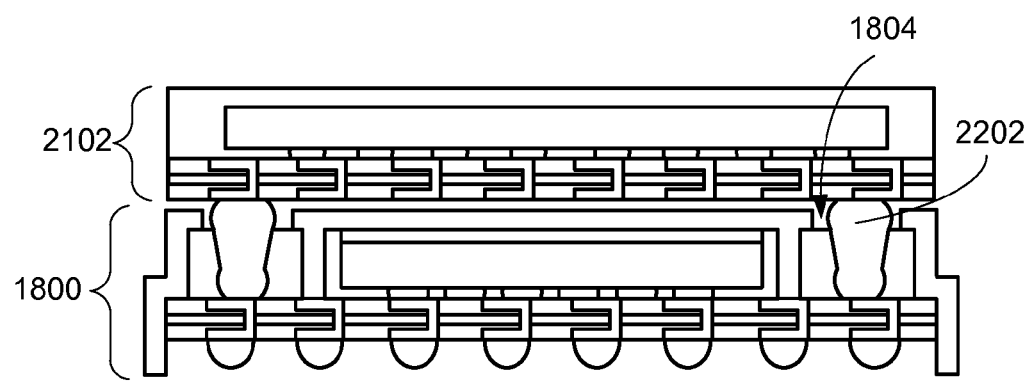
FIG. 22 is a cross-sectional view of the stackable package mounted over the integrated circuit packaging system along the line 22-22 of FIG. 21.

Referring now to FIG. 22, therein is shown a cross-sectional view of the stackable package 2102 mounted over the integrated circuit packaging system 1800 along the line 22-22 of FIG. 21. The stackable package 2102 having a package conductive connector 2202 can be stacked over the integrated circuit packaging system 1800. The package conductive connector 2202 is defined as a connection interface for electrical connection to other components.

For example, the stackable package 2102 can be mounted over the integrated circuit packaging system 1800 with the package conductive connector 2202 mounted within the recess 1912 of FIG. 2 and the opening 1804. The recess 1912 can be filled with the package conductive connector 2202.

Figure 23:
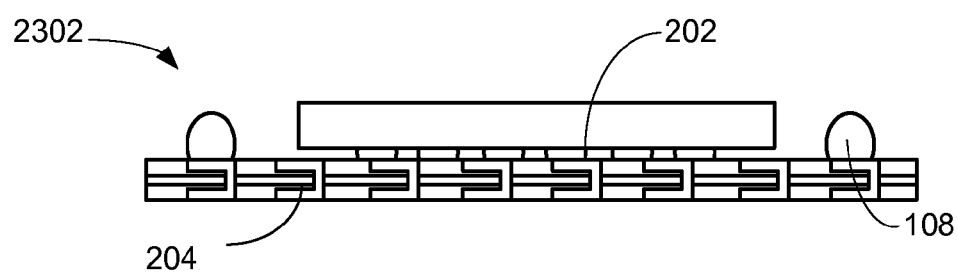
FIG. 23 is a cross-sectional view of a structure for manufacture of the integrated circuit packaging system of FIG. 1 after a mounting phase of the manufacture.

Referring now to FIG. 23, therein is a cross-sectional view of a structure 2302 for manufacture of the integrated circuit packaging system 100 of FIG. 1 after a mounting phase of the manufacture. The structure 2302 can include the integrated circuit 202 and the conductive connector 108 mounted over the package carrier 204.

Figure 24:
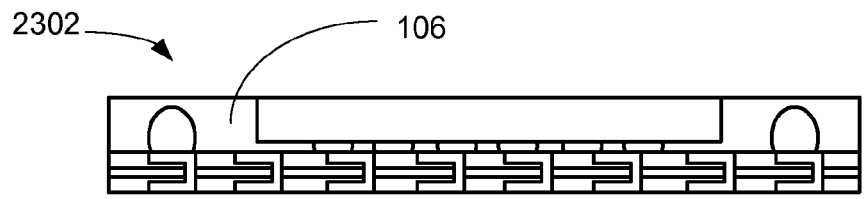
FIG. 24 is a cross-sectional view of the structure for manufacture of the integrated circuit packaging system of FIG. 1 after a mode phase of the manufacture.

Referring now to FIG. 24, therein is a cross-sectional view of the structure 2302 for manufacture of the integrated circuit packaging system 100 of FIG. 1 after a mode phase of the manufacture. The encapsulation 106 can be molded over the structure 2302.

Figure 25:
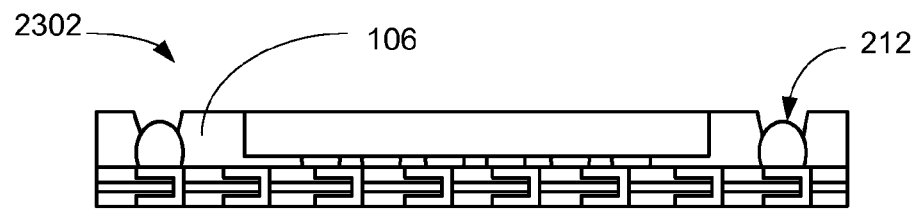
FIG. 25 is a cross-sectional view of the structure after an etch phase of manufacture.

Referring now to FIG. 25, therein is shown a cross-sectional view of the structure 2302 after an etch phase of manufacture. The encapsulation 106 can be etched to form the recess 212.

Figure 26:
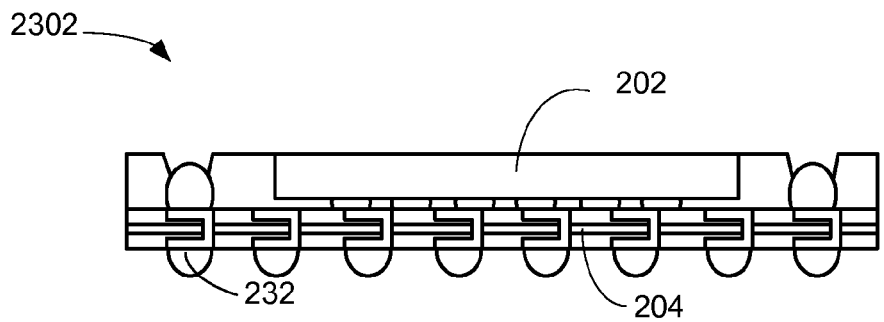
FIG. 26 is a cross-sectional view of the structure after an attach phase of manufacture.

Referring now to FIG. 26, therein is shown a cross-sectional view of the structure 2302 after an attach phase of manufacture. The bottom conductive connector 232 can be attached to a side of the package carrier 204 facing away from the integrated circuit 202.

Figure 27:
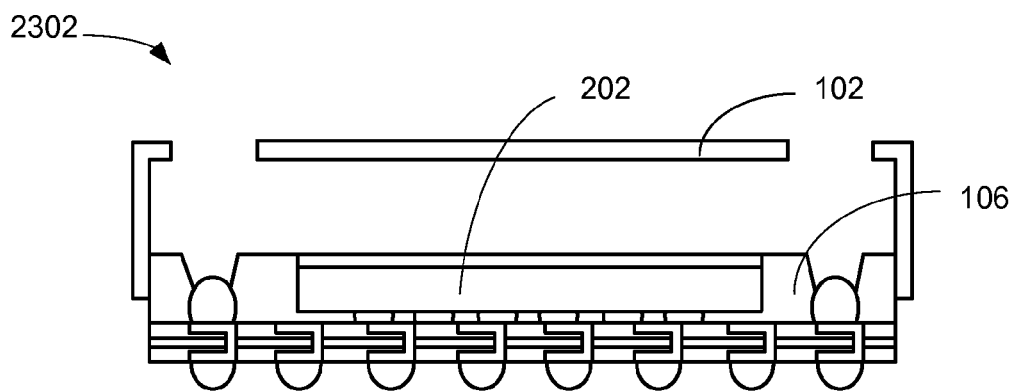
FIG. 27 is a cross-sectional view of a structure for manufacture of the integrated circuit packaging system of FIG. 1 during a mounting phase of the manufacture.

Referring now to FIG. 27, therein is a cross-sectional view of a structure 2302 for manufacture of the integrated circuit packaging system 100 of FIG. 1 during a mounting phase of the manufacture. The heat slug 102 can be mounted over the integrated circuit 202 and the encapsulation 106.

Figure 28:
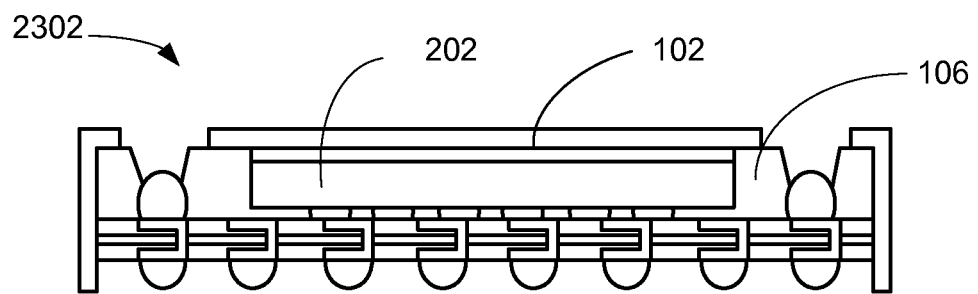
FIG. 28 is a cross-sectional view of a structure for manufacture of the integrated circuit packaging system of FIG. 1 after a mounting phase of the manufacture.

Referring now to FIG. 28, therein is a cross-sectional view of the structure 2302 for manufacture of the integrated circuit packaging system 100 of FIG. 1 after a mounting phase of the manufacture. The heat slug 102 can be mounted over the integrated circuit 202 and the encapsulation 106.

Figure 29:
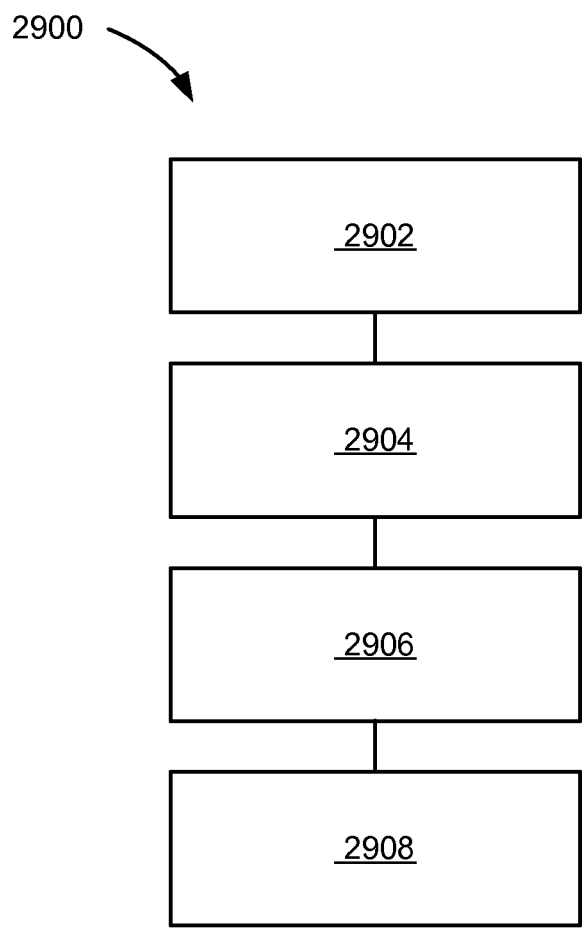
FIG. 29 is a flow chart of a method of manufacture of the integrated circuit packaging system in a further embodiment of the present invention.

Referring now to FIG. 29 is a flow chart of a method 2900 of manufacture of the integrated circuit packaging system in a further embodiment of the present invention. The method 2900 includes: mounting an integrated circuit over a package carrier in block 2902; mounting a conductive connector over the package carrier in block 2904; forming an encapsulation over the integrated circuit, the encapsulation having a recess exposing the conductive connector in block 2906; and mounting a heat slug over the encapsulation, the heat slug having an opening with an opening width greater than a recess width of the recess, the opening exposing a portion of a top surface of the encapsulation in block 2908.

Thus, it has been discovered that the integrated circuit packaging system of the present invention furnishes important and heretofore unknown and unavailable solutions, capabilities, and functional aspects for an integrated circuit packaging system with encapsulation. The resulting method, process, apparatus, device, product, and/or system is straightforward, cost-effective, uncomplicated, highly versatile and effective, can be surprisingly and unobviously implemented by adapting known technologies, and are thus readily suited for efficiently and economically manufacturing integrated circuit packaging systems fully compatible with conventional manufacturing methods or processes and technologies.

Another important aspect of the present invention is that it valuably supports and services the historical trend of reducing costs, simplifying systems, and increasing performance. These and other valuable aspects of the present invention consequently further the state of the technology to at least the next level.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. A method of manufacture of an integrated circuit packaging system comprising:
   mounting an integrated circuit over a package carrier;
   mounting a conductive connector over the package carrier;
   forming an encapsulation over the integrated circuit, the encapsulation having a recess exposing the conductive connector; and
   mounting a heat slug over the encapsulation, the heat slug having:
      an opening with an opening width greater than a recess width of the recess, the opening exposing a portion of a top surface of the encapsulation,
      a teeth gap exposing a bottom conductive connector, and
      a teeth extension of the heat slug covering a bottom gap between a plurality of the bottom conductive connector.

2. The method as claimed in claim 1 wherein mounting the heat slug includes mounting the heat slug having a sidewall in direct contact with an encapsulation side and a carrier side.

3. The method as claimed in claim 1 wherein mounting the heat slug includes mounting the heat slug having a sidewall with a step, the step over a component side of the package carrier.

4. The method as claimed in claim 1 wherein mounting the heat slug includes mounting the heat slug having an inner leg between the conductive connector and the integrated circuit over a component side of the package carrier.

5. A method of manufacture of an integrated circuit packaging system comprising:
   mounting an integrated circuit over a package carrier;
   mounting a conductive connector over the package carrier;
   forming an encapsulation over the integrated circuit, the encapsulation having a recess exposing the conductive connector; and
   mounting a heat slug over the encapsulation, the heat slug having:
      an opening with an opening width greater than a recess width of the recess, the opening exposing a portion of a top surface of the encapsulation and the conductive connector,
      a teeth gap exposing a bottom connector, and
      a teeth extension of the heat slug covering a bottom gap between a plurality of the bottom conductive connector.

6. The method as claimed in claim 5 wherein mounting the heat slug includes mounting the heat slug having an overhang over the top surface of the encapsulation.

7. The method as claimed in claim 5 wherein mounting the heat slug includes mounting the heat slug formed by a single integral structure having a slug top and a sidewall with an adhesive in direct contact with the slug top and the sidewall.

8. The method as claimed in claim 5 wherein mounting the heat slug includes mounting the heat slug with a sidewall directly on a mounting side of a mounting carrier.

9. The method as claimed in claim 5 further comprising mounting a stackable package having a package side over the heat slug, the package side coplanar with a peripheral side of the sidewall.

10. An integrated circuit packaging system comprising:
    a package carrier;
    an integrated circuit over the package carrier;
    a conductive connector over the package carrier;
    an encapsulation over the integrated circuit, the encapsulation having a recess exposing the conductive connector;
    a heat slug over the encapsulation, the heat slug having an opening with an opening width greater than a recess width of the recess, the opening exposing a portion of a top surface of the encapsulation;
    a bottom conductive connector attached to the package carrier; and
    wherein the heat slug includes:
       a teeth gap exposing the bottom conductive connector; and
       a teeth extension covering the bottom gap between a plurality of the bottom conductive connector.

11. The system as claimed in claim 10 wherein the heat slug includes a sidewall in direct contact with an encapsulation side and a carrier side.

12. The system as claimed in claim 10 wherein the heat slug includes a sidewall having a step, the step over a component side of the package carrier.

13. The system as claimed in claim 10 wherein the heat slug includes an inner leg between the conductive connector and the integrated circuit.

14. The system as claimed in claim 10 wherein the further exposes the conductive connector.

15. The system as claimed in claim 14 wherein the heat slug includes an overhang over the top surface of the encapsulation.

16. The system as claimed in claim 14 further comprising:
    an adhesive directly on the top surface of the encapsulation; and
    wherein:
       the heat slug is a single integral structure having a slug top and a sidewall in direct contact with the adhesive.

17. The system as claimed in claim 14 further comprising:
    a mounting carrier having a mounting side; and
    wherein:
       the heat slug includes the heat slug with a sidewall directly on the mounting side of the mounting carrier.

18. The system as claimed in claim 14 further comprising a stackable package having a package side over the heat slug, the package side coplanar with a peripheral side of the sidewall.

* * * * *